United States Patent [19]
Kang et al.

[11] Patent Number: 5,907,186
[45] Date of Patent: May 25, 1999

[54] LEAD-ON-CLIP LEAD FRAME AND SEMICONDUCTOR PACKAGE USING THE SAME

[75] Inventors: Sin Young Kang; Hong Seok Kim; Jung Tae Kwon, all of Ichon, Rep. of Korea

[73] Assignee: Hyundai Electronics Industries Co., Ltd., Kyoungki-do, Rep. of Korea

[21] Appl. No.: 08/863,307

[22] Filed: May 27, 1997

[30] Foreign Application Priority Data

Jun. 24, 1996 [KR] Rep. of Korea .................. 1996 23268

[51] Int. Cl.⁶ ................................................ H01L 23/495
[52] U.S. Cl. ............................ 257/676; 257/666; 257/691
[58] Field of Search .................... 257/666, 676, 257/691, 776

[56] References Cited

U.S. PATENT DOCUMENTS

| | | | |
|---|---|---|---|
| 5,229,329 | 7/1993 | Chai et al. . | |
| 5,250,840 | 10/1993 | Oh et al. ................................. | 257/666 |
| 5,514,905 | 5/1996 | Sakuta et al. ............................ | 257/666 |
| 5,521,426 | 5/1996 | Russell . | |
| 5,585,665 | 12/1996 | Anjoh et al. ............................. | 247/666 |
| 5,612,569 | 3/1997 | Murakami et al. ...................... | 257/666 |

*Primary Examiner*—Carl Whitehead, Jr.
*Assistant Examiner*—S. V. Clark
*Attorney, Agent, or Firm*—Nath & Associates; Gary M. Nath; Harold L. Novick

[57] ABSTRACT

A lead-on-chip lead frame adapted to mount a chip divided into two independent circuit blocks thereon, the independent circuit blocks having pads arranged laterally and symmetrically with respect to a central portion of the chip, respectively. The lead-on-chip lead frame has a plurality of elongated common leads each adapted to wire-bond pads of each pad pair having the same function respectively arranged on the circuit blocks, each common lead extending laterally from the central portion of the chip in such a manner that it is lead out beyond a desired side edge of the chip. In this lead frame, the number of leads is reduced, thereby minimizing the size of the package.

4 Claims, 6 Drawing Sheets

LEAD-ON-CLIP LEAD FRAME AND SEMICONDUCTOR PACKAGE USING THE SAME

BACKGROUND OF THE INVENTION

1. Field of the Invention

The present invention relates to a lead-on-chip lead frame, and more particularly to a lead-on-chip lead frame used for highly integrated semiconductor memory devices in place of a multi-chip package. The present invention also relates to a semiconductor package using such a lead-on-chip lead frame.

2. Description of the Prior Art

Lead-on-chip lead frames have a structure in which leads are arranged on a chip, in order to fabricate highly integrated semiconductor memory devices having a reduced package area while involving a reduced generation of noise at power lines.

A brief description will be made in conjunction with such lead-on-chip lead frames used for highly integrated semiconductor memory devices.

Generally, a lead-on-chip lead frame has leads for power lines such as a ground voltage line and a supply voltage line, leads for control signals such as CASL (Low), CASU (Upper), WE (Write Enable), OE (Output Enable) and RAS signals, leads for input/output signals, and leads for address signals. Each lead has an end extending to a desired position on the central portion of a chip mounted on the frame. That is, the leads are wire-bonded at their ends to pads arranged on the central portion of the chip, respectively. Thus, an electric connection is obtained between the leads and chip. Since the pads are arranged on the central portion of the chip in such a structure, the length of signal transfer lines is minimized. It is also possible to achieve an easy design of signal transfer lines. Accordingly, a stable semiconductor device can be fabricated.

Another lead-on-chip lead frame structure has also been proposed. In this lead-on-chip lead frame structure, each signal transfer lead has an end extending to a desired position on the central portion of a chip mounted on the frame, as in the above-mentioned frame structure. The frame is also provided with power lines, such as a ground voltage lead and a supply voltage lead, extending longitudinally across the central portion of the chip. The power lines are electrically connected to pads on the chip by means of wire bonding.

In such a structure, the transfer of power is carried out by the ground voltage lead or supply voltage lead elongated to the central portion of the chip. Such a power line exhibits low resistance as compared to lines which are arranged as power lines on the chip. Accordingly, an advantage is that the operating speed is improved.

On the other hand, in the case of a highly integrated semiconductor device such as a DRAM of the 1 Giga grade, it may have a size which is too large for the device to be fabricated in a single stepper. In this case, the chip used for such a semiconductor device should be divided into two blocks for DRAM's of the 516 Mega grade. Each circuit block has independent pads for control signal lines, power lines, input/output signals and address signals so that the associated DRAM of, for example, the 512 Mega grade, can operate independently.

FIG. 1 illustrates a lead-on-chip lead frame having a conventional configuration and a chip mounted on the frame. As shown in FIG. 1, the chip, which is denoted by the reference numeral 10, is divided into two independent circuit blocks. The chip has left pads P1 . . . Pn arranged in a single line on the central portion of the left circuit block and right pads P'1 . . . P'n arranged in a single line on the central portion of the right circuit block. The left and right pads are connected to signal lines and power lines, and are independent from each other so as to operate respective DRAM's of, for example, the 512 Mega grade. Left leads L1 . . . Ln and right leads L'1 . . . L'n are also arranged on the chip 10 in such a manner that they have ends respectively disposed adjacent to the left and right pads. The left leads L1 . . . Ln and right leads L'1 . . . L'n extend laterally from the associated pads in such a manner that they protrude from the associated sides of the chip 10, respectively.

On the other hand, FIG. 2 illustrates a lead-on-chip lead frame having another conventional configuration and a chip mounted on the frame. As shown in FIG. 2, the chip, which is denoted by the reference numeral 10, has left pads P1 . . . Pn arranged in a single line on the central portion of the chip 10 and right pads P'1 . . . P'n arranged in a single line on the central portion of the chip 10. Left leads L1 . . . Ln and right leads L'1 . . . L'n are also arranged on the chip 10 in such a manner that they have ends respectively disposed adjacent to the left and right pads. The leads L1 and Ln are connected to each other by a line 20 which is connected to both the leads L1 and Ln while extending along the empty space of the central portion of the chip 10. The leads L'1 and L'n are connected to each other by a line 30 which is connected to both the leads L'1 and L'n while extending along the empty space of the central portion of the chip 10.

FIG. 3 illustrates a semiconductor package which is fabricated by mounting a chip on a lead-on-chip lead frame having the configuration of FIG. 1 or FIG. 2 and performing a wire bonding process and a molding process for the chip-mounted lead frame. As shown in FIG. 3, the semiconductor package has 86 leads which are indexed with their functions or purposes at their ends, respectively. That is, the semiconductor package is provided with leads 1, 18, 69 and 86 for supply voltage VCC, leads 2, 6, 14, 73, 77 and 85 for supply voltage VCCq, leads 19, 42, 45 and 68 for ground voltage VSS, leads 3, 7, 15, 76, 81 and 84 for ground voltage VSSq, leads 23, 24, 25, 26, 61, 62, 64 and 69 for control signals such as CASL, CASU, WE, OE and RAS signals, leads 4, 5, . . . 16 and 17 for input/output signals I/O0 to I/O7, leads 70, 71 . . . 82 and 83 for input/output signals I/O8 to I/O15, and leads 27 . . . 41 and 46 . . . 60 for address signals A0 to A14. Since this configuration has a laterally-symmetrical pad/lead arrangement, it requires a large number of leads.

SUMMARY OF THE INVENTION

As mentioned above, the conventional lead-on-chip lead frames have a configuration which includes independent circuit blocks having a symmetrical structure. For this reason, a symmetrical pad/lead arrangement is necessary. As a result, the size of the resulting package increases.

Therefore, an objective of the invention is to solve the above-mentioned problem, that is, an increase in the package size, and to provide a lead-on-chip frame having a configuration in which among laterally-symmetrical pads respectively arranged on two circuit blocks of a chip mounted on the frame, those having the same functions are connected together in pairs by common lines, respectively, thereby minimizing the package size.

Another objective of the invention is to provide a semiconductor package using a lead-on-chip frame having a configuration in which among laterally-symmetrical pads respectively arranged on two circuit blocks of a chip mounted on the frame, those having the same functions are connected together in pairs by common lines, respectively.

In accordance with one aspect, the present invention provides a lead-on-chip lead frame adapted to mount a chip divided into two independent circuit blocks thereon, the independent circuit blocks having pads laterally symmetrically arranged with respect to a central portion of the chip, respectively, comprising: a plurality of elongated common leads each adapted to wire-bond pads of each pad pair having the same function respectively arranged on the circuit blocks, each common lead extending laterally from the central portion of the chip in such a manner that it is lead out beyond a desired side edge of the chip.

Pads of each pad pair wire-bonded to each common lead are coupled to a power line, a control signal line or an address signal.

In accordance with another aspect, the present invention provides a semiconductor package including a chip divided into two independent circuit blocks and a lead-on-chip lead frame adapted to mount the chip thereon, the independent circuit blocks having pads laterally symmetrically arranged with respect to a central portion of the chip, respectively, comprising: a plurality of elongated common leads each adapted to wire-bond pads of each pad pair having the same function respectively arranged on the circuit blocks, each common lead extending laterally from the central portion of the chip in such a manner that it is lead out beyond a desired side edge of the chip; and independent leads respectively wire-bonded to pads respectively arranged on the circuit blocks and coupled to input/output signals.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENTS

Figure 1:
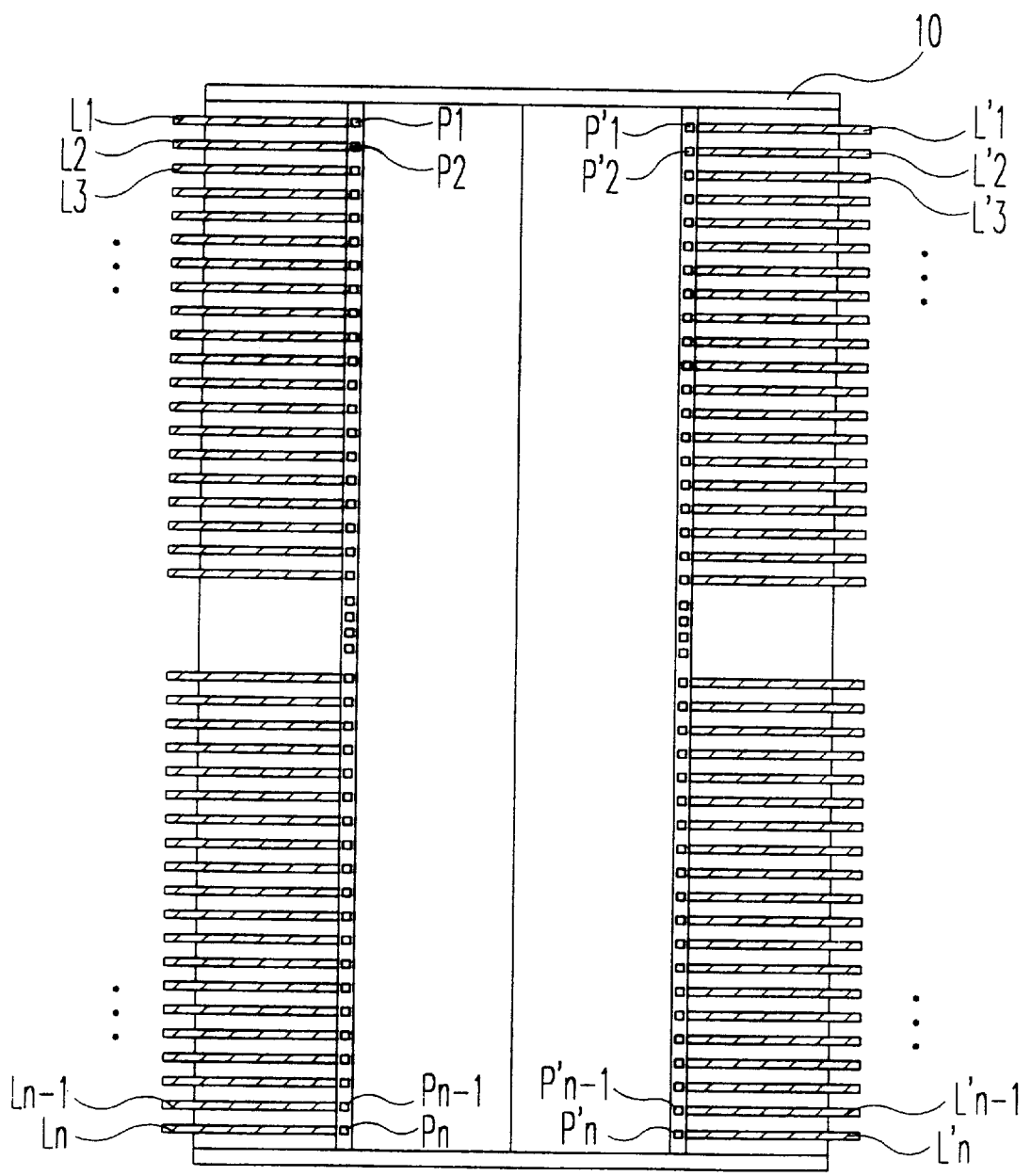
FIG. 1 is a plane view illustrating a lead-on-chip lead frame having a conventional configuration.
Figure 2:
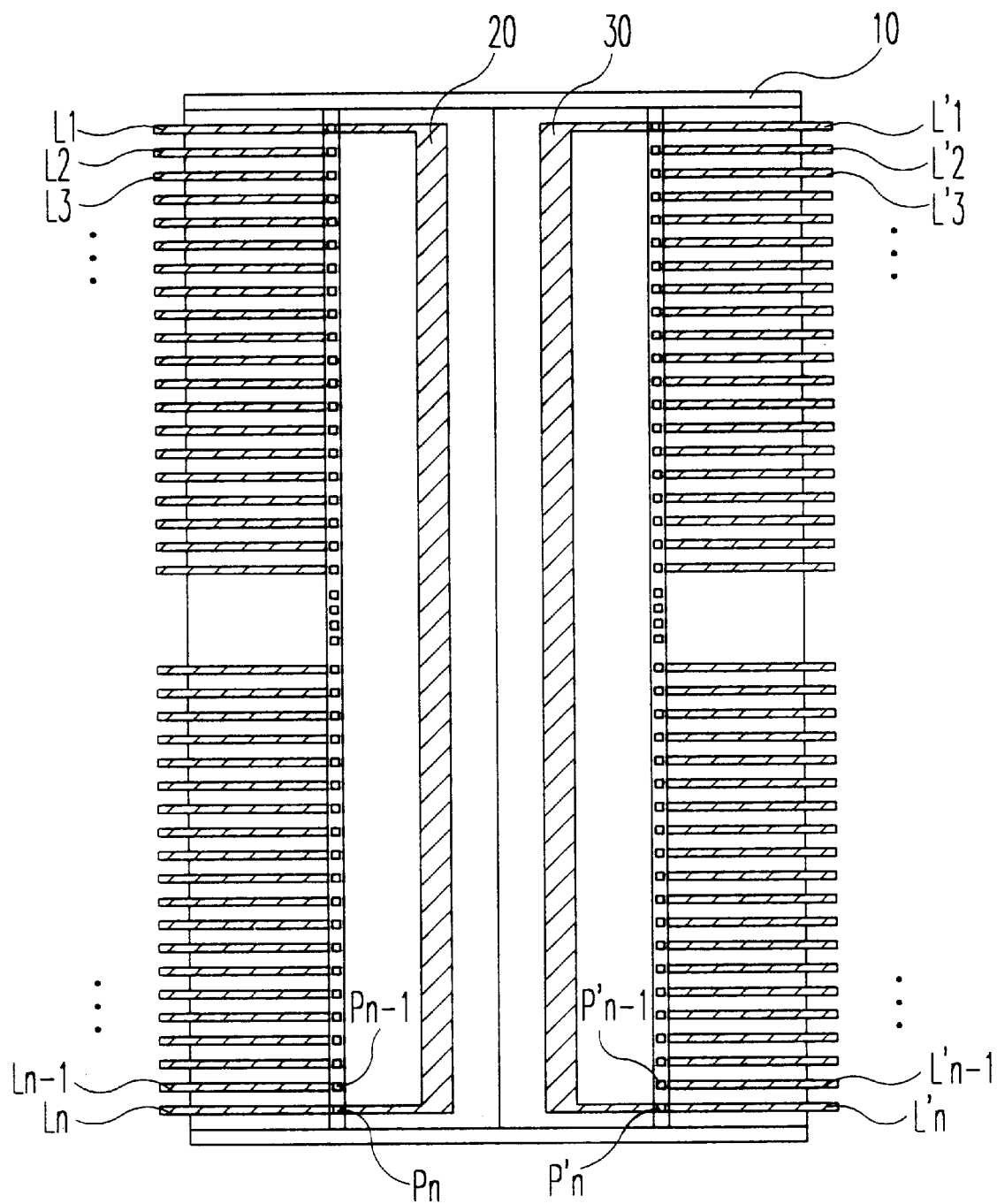
FIG. 2 is a plane view illustrating a lead-on-chip lead frame having another conventional configuration.
Figure 3:
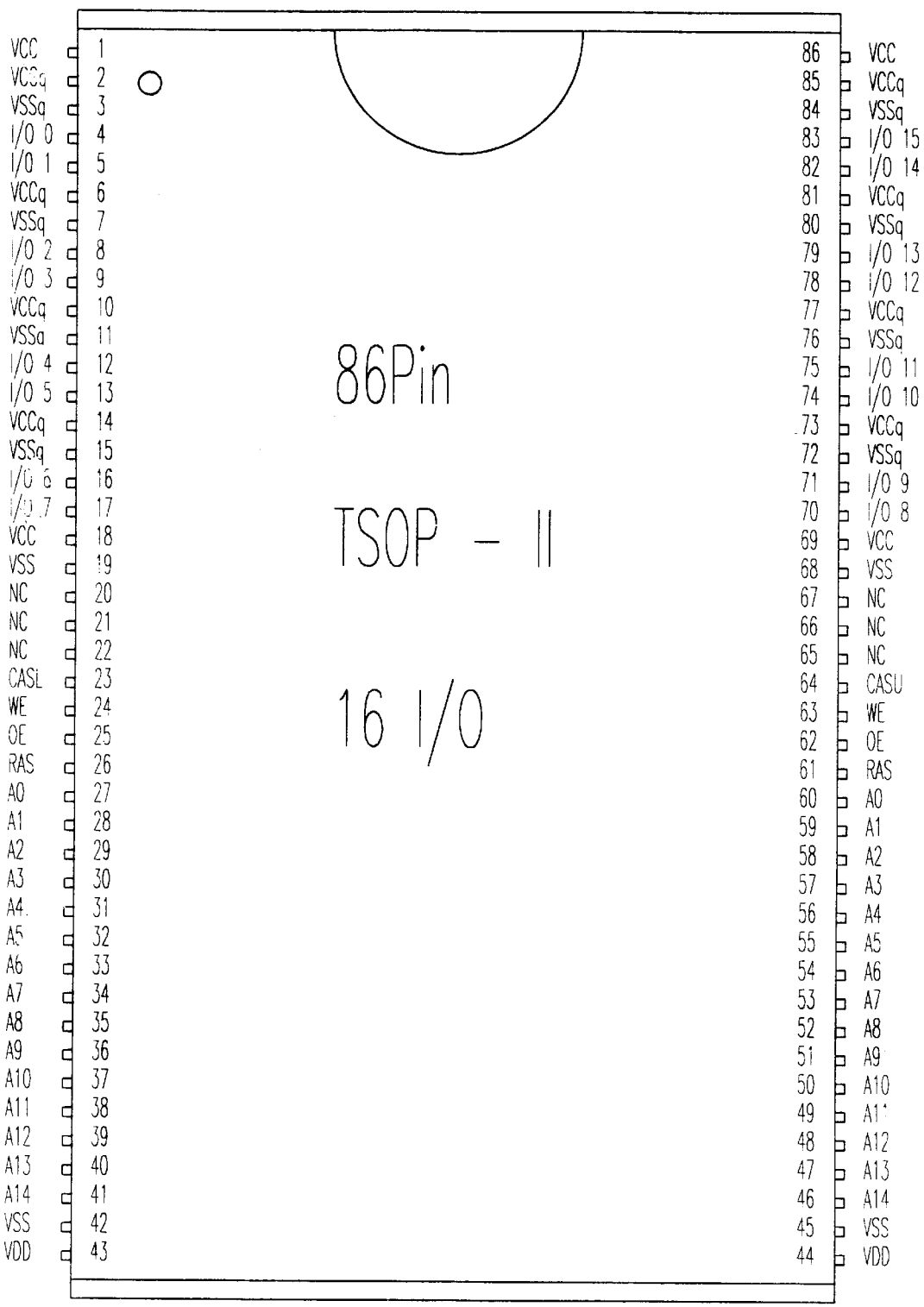
FIG. 3 is a plane view illustrating a semiconductor package which is fabricated by mounting a chip on a lead-on-chip lead frame having the configuration of FIG. 1 or FIG. 2.
Figure 4:
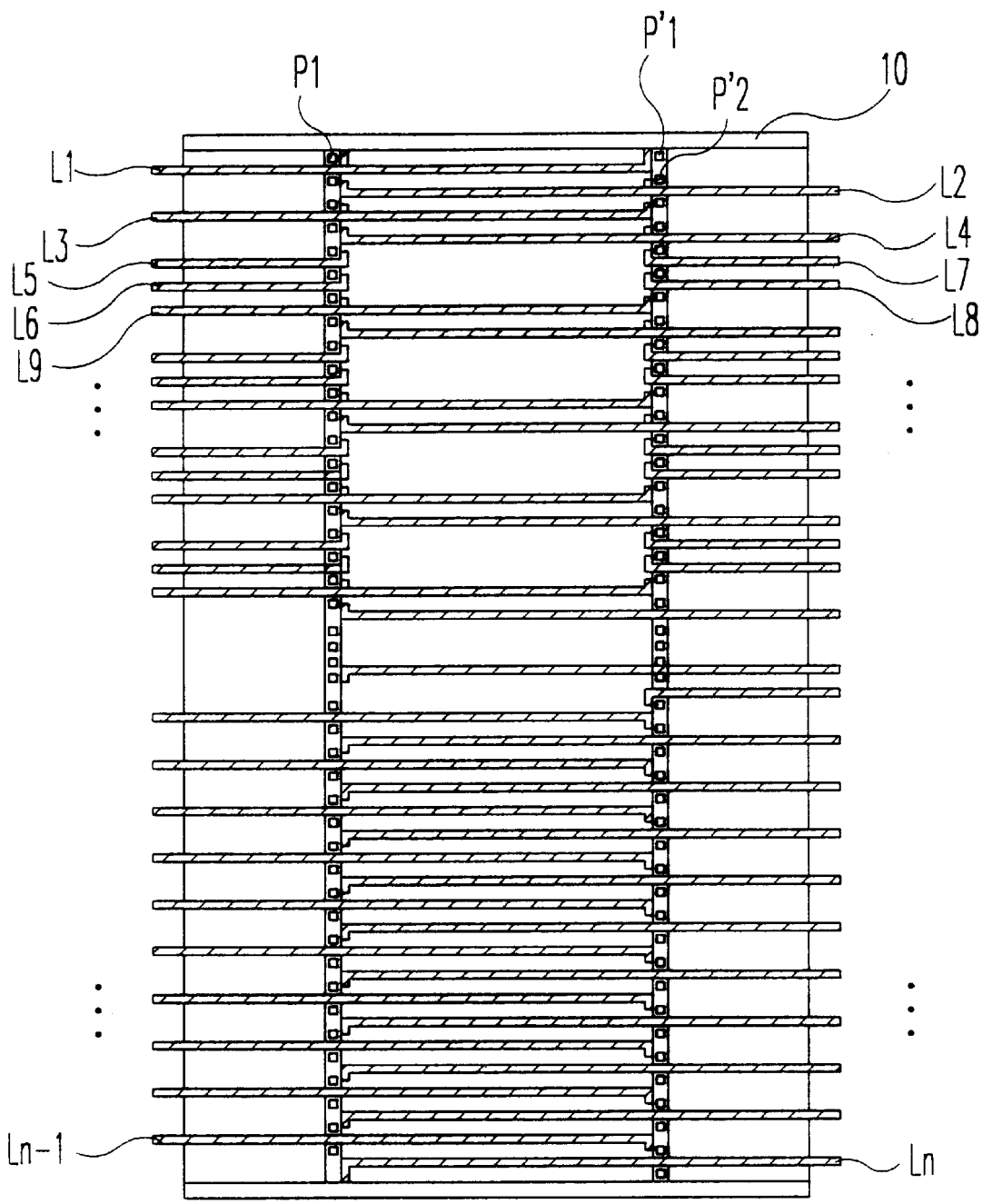
FIG. 4 is a plane view illustrating a lead-on-chip lead frame having a configuration according to the present invention.

Referring to FIG. 4, a lead-on-chip lead frame having a configuration according to the present invention is illustrated. The lead-on-chip lead frame is adapted to mount a chip having two laterally-symmetrical and independent circuit blocks thereon.

As shown in FIG. 4, the chip, which is denoted by the reference numeral 10, has left pads P1 . . . Pn arranged in a single line on the central portion of the chip 10 and right pads P'1 . . . P'n arranged in a single line on the central portion of the chip 10. The left and right pads include pads coupled to a variety of power such as for example, VCC, VCCq, VSSq and VSS, pads coupled to control signals such as for example, CASL, CASU, WE, OE and RAS, pads coupled to I/O signals and pads coupled to address signals A0 to A14, respectively.

The lead-on-chip lead frame includes a plurality of elongated common leads each adapted to wire-bond pads of each pad pair having the same function. One of the adjacent common leads is lead out to the left whereas the other lead is lead out to the right.

The pad pairs connected by the common leads include pads coupled to a variety of power such as for example, VCC, VCCq, VSSq and VSS, pads coupled to control signals such as for example, CASL, CASU, WE, OE and RAS, and pads coupled to address signals A0 to A14.

For the pads coupled to I/O signals, the lead-on-chip lead frame includes independent leads lead out to the left for the left pads and to the right for the right pads.

The leads L1, L3, L5 . . . Ln-3 and Ln-1, which are lead out to the left, are associated with odd ones of the left and right pads whereas the leads L2, L4, L6 . . . Ln-2 and Ln, which are lead out to the right, are associated with even ones of the right.

Figure 5:
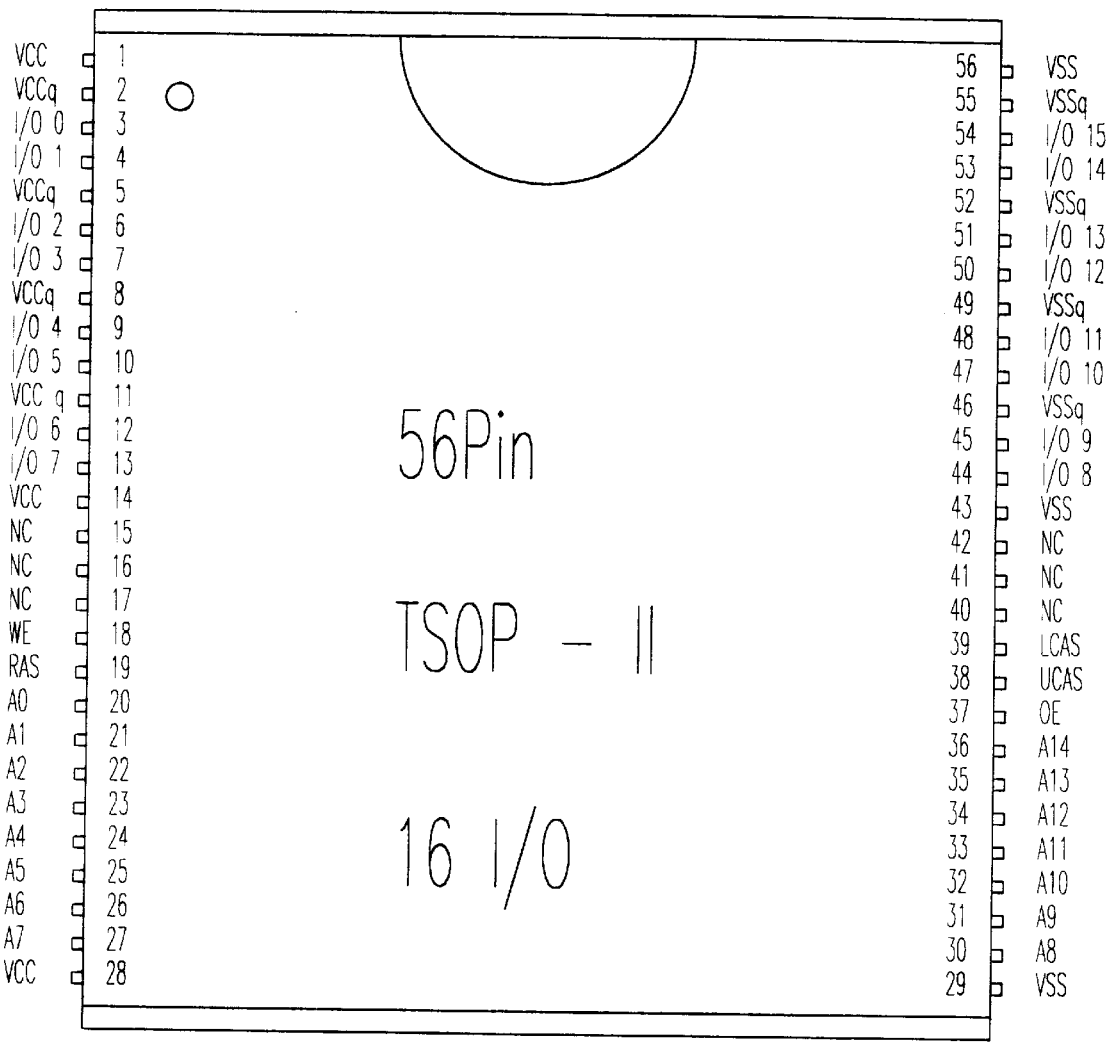
FIG. 5 is a plane view illustrating a semiconductor package which is fabricated by mounting a chip on a lead-on-chip lead frame having the configuration of FIG. 4.

FIG. 5 illustrates a semiconductor package which is fabricated by mounting a chip on a lead-on-chip lead frame having the configuration of FIG. 4 and performing a wire bonding process and a molding process for the chip-mounted lead frame.

As shown in FIG. 5, the semiconductor package has 56 leads which are indexed with their functions or purposes at their ends, respectively. In this semiconductor package, the number of leads is reduced, in contrast to the conventional semiconductor packages. In FIG. 5, the index NC (not the connection) represents leads which are not used.

In accordance with the present invention, left and right pads of each pad pair coupled to a power line VCC, VCCq, VSS or VSSq, a control signal LCAS (Low CAS), UCAS (Upper CAS), WE, OE or RAS, or an address signal A0 . . . or A14, are connected to a common line by means of wire bonding whereas left pads coupled to I/O signals I/O1 . . . I/O7 and right pads coupled to I/O signals I/O8 . . . I/O15 are connected to independent leads, respectively, without using the wire bonding.

Although the semiconductor package fabricated in accordance with the present invention uses a chip including two independent circuit blocks, the chip can operate as a single circuit. This is because the inputting and outputting of address signals can be achieved in one of the circuit blocks which is selected by I/O signals.

Figure 6:
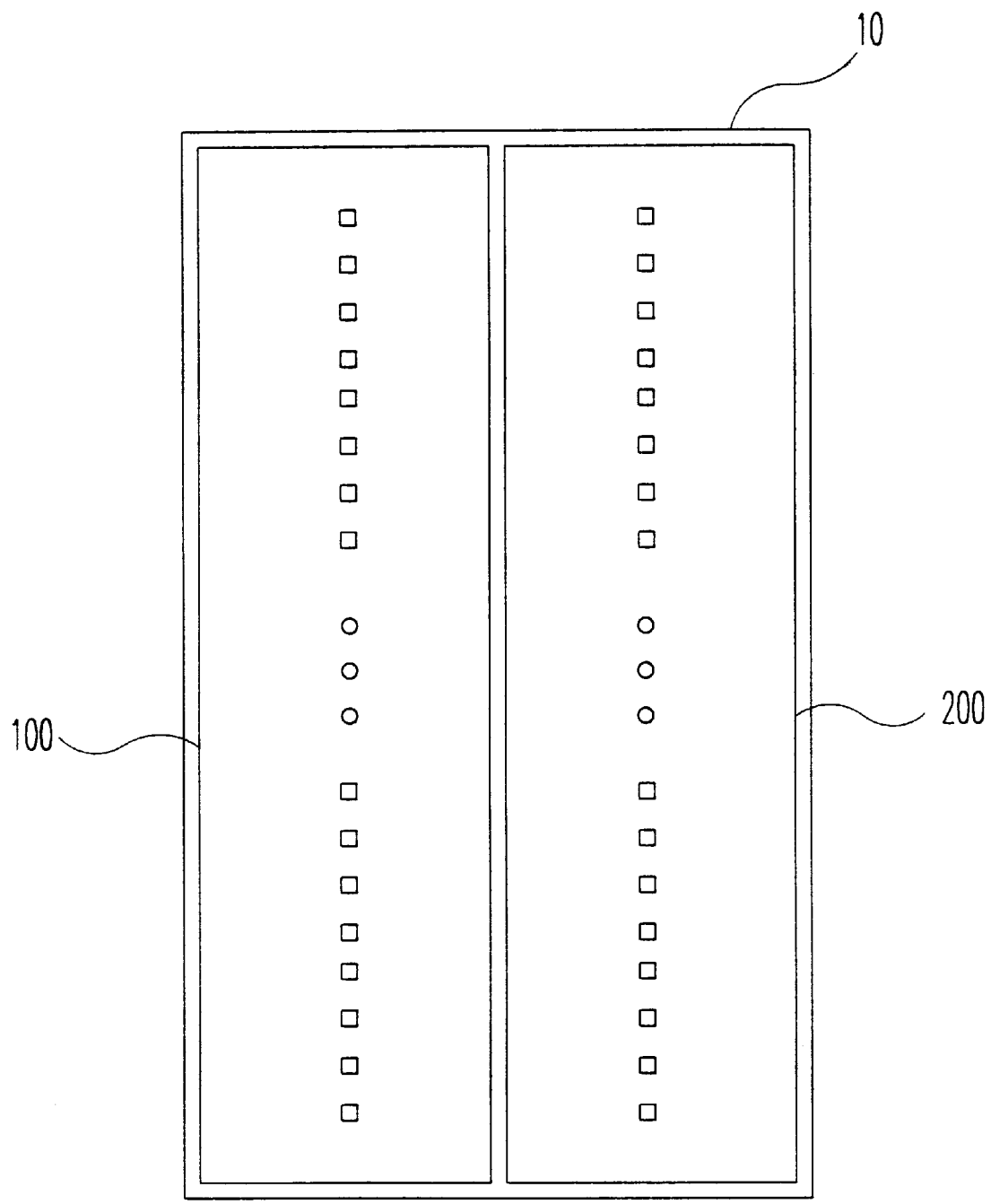
FIG. 6 is a plane view illustrating a highly integrated semiconductor device fabricated using the lead-on-chip lead frame of the present invention.

FIG. 6 illustrates a highly integrated semiconductor device fabricated using the lead-on-chip lead frame of the present invention. The semiconductor device includes a chip 10 divided into two independent circuit blocks 100 and 200. Where the semiconductor device is a DRAM of the 1 Giga grade, each circuit block may be a DRAM of the 512 Mega grade (64 M×8). Referring to FIG. 6, pads are shown which are arranged in a single line on the central portion of each circuit block.

Although the present invention has been described as being applied to semiconductor devices of the 1 Giga DRAM grade, it may also be applied to semiconductor devices of a higher or lower grade.

As is apparent from the above description, the present invention provides a lead-on-chip frame having a configuration in which among laterally-symmetrical pads respectively arranged on two circuit blocks of a chip mounted on the frame, those having the same functions are connected together in pairs by common lines, respectively, thereby minimizing the area occupied by leads. Accordingly, it is possible to minimize the package size.

In the case of a highly integrated semiconductor device including a chip provided with a single circuit block, a degradation in the performance of an element included in the circuit block may render the whole device useless. In the case of a semiconductor device including a chip divided into independent circuit blocks, it can normally operate even when one of the circuit blocks is degraded in performance because the other circuit block can normally operate. Accordingly, the present invention provides an improvement in the yield of semiconductor devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A lead-on-chip lead frame adapted to mount a chip divided into two independent circuit blocks thereon, the independent circuit blocks having lateral pairs of pads arranged symmetrically with respect to a central portion of the chip, respectively, comprising:

a plurality of elongated common leads each adapted to wire-bond pads of each lateral pair of pads having the same function having a power line, a control signal line or an address signal respectively arranged on the circuit blocks across from one another, wherein adjacent common leads extend laterally in opposite directions and each common lead extending laterally from the central portion of the chip in such a manner that it is lead out beyond a desired side edge of the chip.

2. The lead-on-chip lead frame in accordance with claim 1, wherein pads of each pad pair wire-bonded to each common lead are coupled to a power line, a control signal line or an address signal.

3. The lead-on-chip lead frame in accordance with claim 1, further comprising:

independent leads respectively wire-bonded to pads respectively arranged on the circuit blocks and coupled to input/output signals.

4. A semiconductor package including a chip divided into two independent circuit blocks and a lead-on-chip lead frame adapted to mount the chip thereon, the independent circuit blocks having lateral pairs of pads arranged symmetrically with respect to a central portion of the chip, respectively, comprising:

a plurality of elongated common leads each adapted to wire-bond pads of each lateral pair of pads having the same function having a power line, a control signal line or an address signal respectively arranged on the circuit blocks across from one another, wherein adjacent common leads extend laterally in opposite direction and each common lead extending laterally from the central portion of the chip in such a manner that it is lead out beyond a desired side edge of the chip; and independent leads respectively wire-bonded to pads respectively arranged on the circuit blocks and coupled to input/output signals.

* * * * *